(12) United States Patent

Namkung

(10) Patent No.: US 9,564,079 B2
(45) Date of Patent: Feb. 7, 2017

(54) FLEXIBLE DISPLAY DEVICE

(71) Applicant: SAMSUNG DISPLAY CO., LTD., Yongin-si, Gyeonggi-do (KR)

(72) Inventor: Jun Namkung, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 26 days.

(21) Appl. No.: 14/325,170

(22) Filed: Jul. 7, 2014

(65) Prior Publication Data

US 2015/0022430 A1    Jan. 22, 2015

(30) Foreign Application Priority Data

Jul. 31, 2013  (KR) .................... 10-2013-0091094

(51) Int. Cl.
| | | |
|---|---|---|
| H01L 29/08 | (2006.01) | |
| G09G 3/32 | (2016.01) | |
| H01L 51/56 | (2006.01) | |
| H01L 27/32 | (2006.01) | |

(52) U.S. Cl.
CPC ............ *G09G 3/32* (2013.01); *H01L 27/3244* (2013.01); *H01L 27/3258* (2013.01); *H01L 51/56* (2013.01); *G09G 2310/0264* (2013.01); *H01L 2251/5338* (2013.01); *H01L 2251/566* (2013.01)

(58) Field of Classification Search
None
See application file for complete search history.

(56) References Cited

U.S. PATENT DOCUMENTS

| | | | | |
|---|---|---|---|---|
| 8,766,323 B2* | 7/2014 | Kim | ............... | H01L 51/5253 257/207 |
| 2003/0034497 A1* | 2/2003 | Yamazaki | ........... | H01L 27/3244 257/86 |
| 2003/0047280 A1* | 3/2003 | Takayama | ............... | B32B 7/06 156/708 |
| 2011/0253709 A1* | 10/2011 | Kang | ............... | H01L 27/3251 220/2.1 R |
| 2012/0080664 A1* | 4/2012 | Kim | ............... | H01L 51/5253 257/40 |
| 2013/0230665 A1* | 9/2013 | Park | ............... | H01L 51/5253 427/535 |
| 2014/0291617 A1* | 10/2014 | Kim | ............... | H01L 51/56 257/40 |
| 2015/0022430 A1* | 1/2015 | Namkung | ............... | G09G 3/32 345/82 |
| 2015/0036299 A1 | 2/2015 | Namkung et al. | | |

FOREIGN PATENT DOCUMENTS

| | | |
|---|---|---|
| KR | 10-2007-0051087 A | 5/2007 |
| KR | 10-2011-0005499 A | 1/2011 |
| KR | 10-2012-0074744 A | 7/2012 |
| KR | 10-2015-0015257 | 2/2015 |
| KR | 10-2015-0016053 | 2/2015 |

* cited by examiner

*Primary Examiner* — David E Graybill
(74) *Attorney, Agent, or Firm* — Lewis Roca Rothgerber Christie LLP

(57) ABSTRACT

A flexible display device includes a flexible display panel including: a plastic film; a pixel circuit on the plastic film; a light emitting element; and an inorganic layer. Openings are in the inorganic layer along a cutting line for cutting the flexible display panel.

15 Claims, 6 Drawing Sheets

FLEXIBLE DISPLAY DEVICE

CROSS-REFERENCE TO RELATED APPLICATION

This application claims priority to and the benefit of Korean Patent Application No. 10-2013-0091094, filed in the Korean Intellectual Property Office on Jul. 31, 2013, the entire contents of which are incorporated herein by reference.

BACKGROUND (1) Field

The present disclosure relates to a flexible display device.

(2) Description of the Related Art

An organic light emitting diode (OLED) display may have a bending characteristic when a flexible substrate, such as a plastic film, is used instead of a rigid substrate, such as glass.

That is, a flexible OLED display includes a plastic film, a pixel circuit that is formed on the plastic film, and, for example, a light emitting element, such as an organic light emitting diode.

A plurality of inorganic layers, such as an interlayer insulating layer, a gate insulating layer, a buffer layer, and/or a barrier layer, may be formed on the plastic film.

In a manufacturing process of a flexible display device, a plastic film is positioned on a rigid carrier substrate, such as glass, and after forming a pixel circuit, an organic light emitting diode, and a plurality of inorganic layers on the plastic film, the plastic film including the pixel circuit, the organic light emitting diode, and the plurality of inorganic layers is separated from the carrier substrate. Such plastic film may also be referred to as a flexible display panel.

After being processed as such, the flexible display panel is cut to a panel size.

FIG. 1 is a cross-sectional view of the flexible display panel illustrating a cutting region thereof.

For a simplified drawing, the pixel circuit and the light emitting element are not illustrated in FIG. 1; however, the plurality of inorganic layers that are formed on the plastic film are illustrated.

As shown in FIG. 1, when the plastic film 2 laminated with a plurality of inorganic layers 12, 14, 16, and 18 is cut, an upper protection film 6 and a lower protection film 4 are laminated on top and bottom surfaces of the plastic film 2 (e.g., on top and bottom surfaces of the display panel).

In order to cut the flexible display panel with the upper and lower protection films 6 and 4 respectively laminated thereon, a mechanical cutting method is used to forcibly cut the flexible display panel during which the flexible display panel is pressed due to contact from a cutting knife (e.g., the mechanical cutting method applies pressure to the flexible display panel).

As such, when the flexible display panel is cut by a mechanical cutting method, cracks may occur in the inorganic layers depending on an amount of impact or force delivered to the panel at the time of cutting.

Further, because the cutting knife penetrates through the upper and lower protection films, the flexible display panel may bend when being cut, and when this occurs, cracks due to such bending may occur in the flexible display panel.

The cracks occurring in the flexible display panel are linearly formed at (e.g., around) a cutting line (e.g., the cracks extend in a generally linear direction).

Accordingly, the linearly formed cracks can be transmitted to (e.g., may extend or migrate to) an active region of the panel when performing a subsequent process or a reliability test, thereby causing shrinkage and/or reduced performance of the panel.

The above information disclosed in this Background section is only for enhancement of understanding of the background of the invention, and therefore, it may contain information that does not form the prior art that is already known in this country to a person of ordinary skill in the art.

SUMMARY

One example embodiment provides a flexible display device capable of preventing cracks that occur when cutting a flexible display panel from extending or transmitting to an active region thereof.

Another example embodiment provides a flexible display device capable of forming round-shaped cracks (e.g., non-linear cracks) at cutting edges of a flexible display panel at the time of cutting thereof.

A further example embodiment provides a flexible display device capable of preventing shrinkage of a flexible display panel.

An example embodiment provides a flexible display device including: a flexible display panel including a plastic film, a pixel circuit on the plastic film, a light emitting element, and an inorganic layer in which openings are in the flexible display panel along a cutting line for cutting the flexible display panel.

The inorganic layer may include an interlayer insulating layer, a gate insulating layer, a buffer layer, and a barrier layer.

The openings may be in at least one of the interlayer insulating layer, the gate insulating layer, the buffer layer, or the barrier layer.

The openings may have a circular shape.

Centers of the circular openings may be on the cutting line.

Diameters of the openings may be in a range of 10 μm to 100 μm.

The openings may include a plurality of openings, and the plurality of openings may be arraigned along the cutting line of the flexible display panel.

Adjacent openings among the plurality of openings may be spaced by an interval that is smaller than diameters of the openings.

The openings may be filled with a resin.

The resin may include a urethane-based resin, an epoxy-based resin, or an acryl-based resin.

The flexible display device according to one or more of the example embodiments may prevent the cracks from extending or transmitting to the active region of the flexible display panel because openings (e.g., holes) are formed on the cutting line of the flexible display panel such that the cracks occurring during cutting are curvedly formed along the circumference of the openings.

Accordingly, the flexible display device according to the example embodiments of the present invention may prevent shrinkage of the flexible display panel that is caused by the cracks that are generated during the cutting.

DETAILED DESCRIPTION

Figure 1:
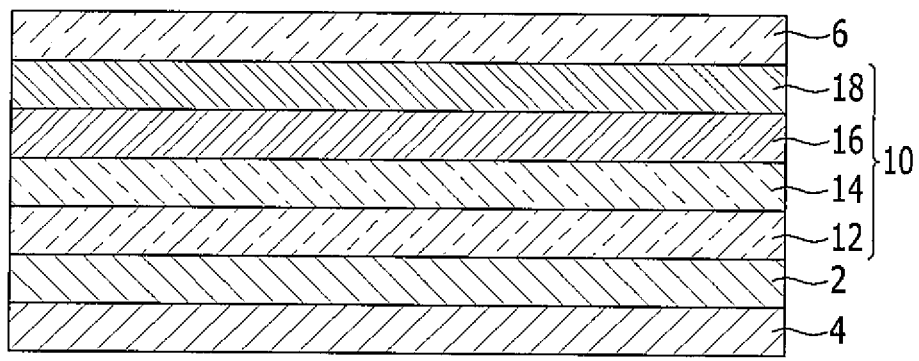
FIG. 1 is a cross-sectional view of a flexible display panel.

Hereinafter, example embodiments of the present invention will be described in detail with reference to the attached drawings such that the present invention can be easily put into practice by those skilled in the art.

As those skilled in the art would realize, the described embodiments may be modified in various different ways, all without departing from the spirit or scope of the present invention.

The drawings and description herein are to be regarded as illustrative in nature and not restrictive. Like reference numerals designate like elements throughout the specification.

Throughout this specification, unless explicitly described to the contrary, the words "include", "comprise", and variations such as "includes", "including", "comprises", and "comprising", will be understood to imply the inclusion of stated elements but not the exclusion of any other elements. In addition, throughout this specification, it will be understood that when an element such as a layer, film, region, or substrate is referred to as being "on" another element, it can be directly on the other element or intervening elements may also be present.

Further, in the specification, the word "on" means positioning on or below the object portion and does not necessarily mean positioning on the upper side of the object portion based on a gravity direction. Further, the use of "may" when describing embodiments of the present invention relates to "one or more embodiments of the present invention".

Figure 2:
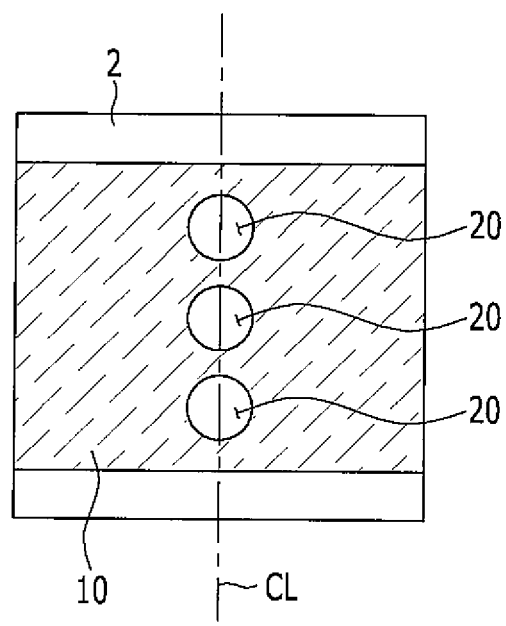
FIG. 2 is a top plan view showing a flexible display device before cutting according to a first example embodiment.

FIG. 2 is a top plan view showing a flexible display device before cutting according to a first example embodiment.

Figure 3:
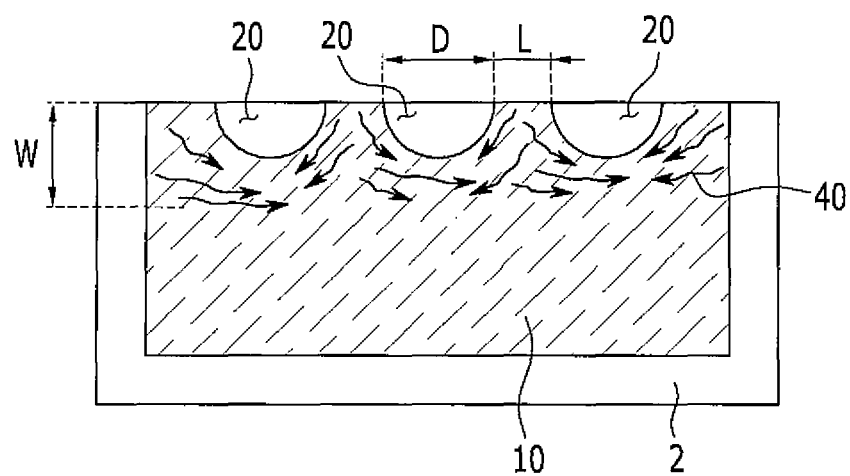
FIG. 3 is a top plan view showing the flexible display panel shown in FIG. 2 after cutting.

FIG. 3 is a top plan view showing the flexible display panel shown in FIG. 2 after cutting.

Figure 4:
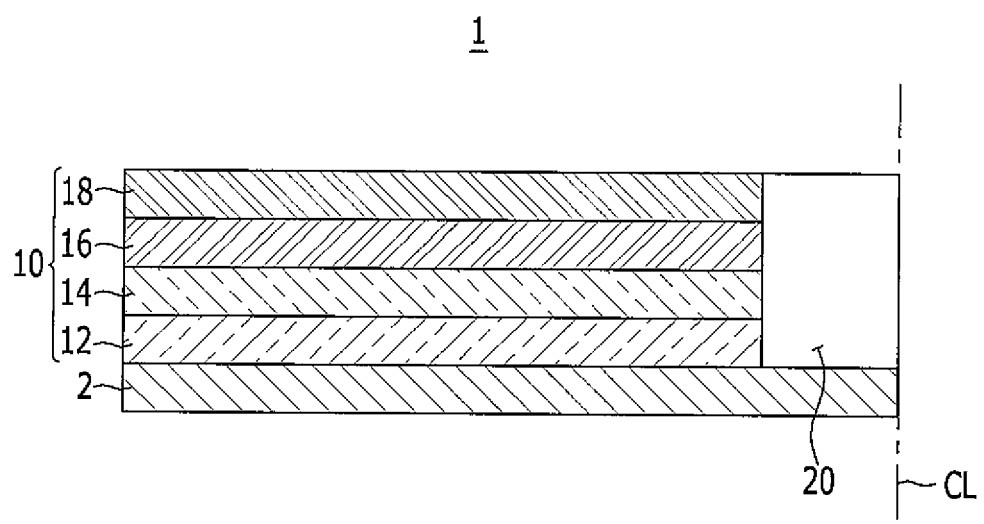
FIG. 4 is a cross-sectional view of FIG. 3.

FIG. 4 is a cross-sectional view of FIG. 3.

For simplified drawings, a pixel circuit and a light emitting element are not illustrated in FIGS. 2 to 6; however, a plurality of inorganic layers that are formed on the plastic film are illustrated.

Referring to FIGS. 2 to 4, in the flexible display panel 1 of the flexible display device according to the example embodiment, holes 20 (e.g., openings, depressions, or cavities) are formed in an inorganic layer 10.

In this embodiment, the inorganic layer 10 may include at least one of an interlayer insulating layer 18, a gate insulating layer 16, a buffer layer 14, and a barrier layer 12, but the inorganic layer 10 (e.g., the inorganic layer 10 formed with the holes 20) is not limited thereto.

In this embodiment, the holes 20 are formed in the inorganic layer 10 on a cutting line (CL) for cutting the flexible display panel 1, and a plurality of holes 20 may be formed along (e.g., arranged along) the cutting line (CL).

Referring to FIGS. 2 and 3, the holes 20 may be formed in a circular shape (e.g., each hole may have a circular shape), and centers of the circular holes 20 may be positioned on the cutting line (CL).

In this embodiment, a diameter of the circular holes 20 may be in a range of about 10 μm to about 100 μm.

When the diameter of the holes 20 is smaller than about 10 μm, it is difficult to define a distance between the holes, and the holes formed in plural may be too small to be distinguished as individual or separate holes.

According to the example embodiment, the holes 20 formed in the inorganic layer 10 may be formed by a photolithography process.

If the size of the holes 20 is too small, e-beam lithography or a high-cost, complicated processing device should be used to form the holes, which can be expensive.

Meanwhile, when considering that a width W of cracks 40 occurring during cutting (e.g., cell-cutting) is generally in a range of about 50 μm to about 150 μm, if the diameter of the holes 20 is greater than 100 μm, the cracks 40 occurring during the cutting process may be linearly formed in a direction perpendicular to the cutting line CL before they are circularly formed (e.g., the cracks may be linearly formed between or around the holes 20).

Thus, according to the example embodiment, the holes 20 may be formed to have a diameter D in a range of about 10 μm to about 100 μm.

When the holes 20 are formed to have the diameter in the range of about 10 μm to about 100 μm, an interval L between the holes 20 (e.g., between adjacent holes 20) may be smaller than the diameter D of the holes 20.

When the interval L between the holes 20 is greater than the diameter D of the holes 20, the cracks 40 may be linearly formed (e.g., linearly formed between adjacent holes 20) instead of being curvedly formed in a round shape.

Meanwhile, in the first example embodiment, the holes 20 are circularly formed, but they may be formed in an oval shape or another curved line shape.

In this case, according to the first example embodiment as shown in FIG. 4, the holes 20 having the same size may be formed on the plastic film, and for example, in four inorganic layers that are formed on a substrate (e.g., formed on the plastic film 2), for example, the interlayer insulating layer 18, the gate insulating layer 16, the buffer layer 14, and the barrier layer 12.

However, holes 20 that are respectively formed in different layers may have different sizes.

In this case, according to the first example embodiment, the holes 20 in the inorganic layer 10 may be formed by a micro-scale patterning process among manufacturing processes of the flexible display panel.

When a manufacturing process of the flexible display device is schematically described, the manufacturing process of the flexible display device may include processes for forming a semiconductor layer on a substrate (e.g., on a mother substrate), forming a storage electrode, and forming a gate electrode and a gate insulating layer pattern.

Next, source and drain electrode patterns are formed on the substrate, and an organic layer pattern is formed to cover the source and drain electrodes.

Subsequently, a pixel electrode and then a pixel definition layer may be formed on the substrate.

In such a manufacturing process of the flexible display device, the process for forming patterns on the inorganic layer 10 may be included as an additional process for micro-patterning.

In one embodiment, the additional process may be performed after forming the gate insulating layer pattern or after a process for forming the organic layer pattern that covers the source and drain electrodes.

Further, the additional process may be performed after a process for forming the pixel electrode or forming the pixel definition layer.

In one embodiment, the micro-scale patterning process may be performed by a conventional photolithography process.

In one embodiment, in the photolithography process for forming the holes 20 in the inorganic layer 10, the holes 20 may be formed by dry etching, but the process is not limited thereto, and the holes 20 may also be formed by wet etching.

Because the photolithography process is a generally well-known process, a detailed description may be omitted.

In the first example embodiment, an embodiment in which the holes 20 are formed in the inorganic layer 10 by micro-patterning of the inorganic layer 10 using the photolithography process during the manufacturing process of the flexible display device has been described. However, the present invention is not limited thereto, and the flexible display device according to the present example embodiment may be understood to include all configurations in which a plurality of holes 20 are formed in the inorganic layer 10 by using disclosed processes or methods for forming the holes 20 on the cutting line CL of the flexible display panel 1.

In the first example embodiment, the size (e.g., the diameter), the interval between, and the shapes and positions of the holes 20 that are formed on the cutting line CL may be modified in various ways depending on sizes and shapes of the flexible display device, and the present embodiment is not limited to the embodiments disclosed herein.

According to the second example embodiment, the holes formed in the inorganic layer of the flexible display device may be formed in some of a plurality of inorganic layers.

Figure 5:
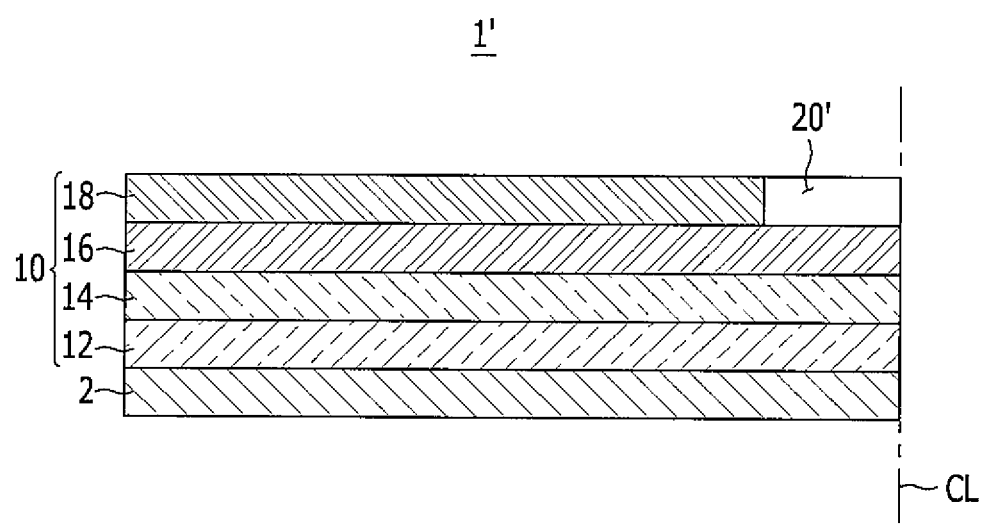
FIG. 5 is a cross-sectional view of a flexible display device according to a second example embodiment.

FIG. 5 is a cross-sectional view of a flexible display panel 1' of a flexible display device according to the second example embodiment.

Referring to FIG. 5, the display device according to the second example embodiment may have a configuration in which holes 20' may be formed, for example, only in an interlayer insulating layer 18 and may not be formed in the other layers, such as a gate insulating layer 16, a buffer layer 14, and a barrier layer 12.

In this embodiment, once the holes 20' are formed in one or some of the plurality of inorganic layers, cracks 40 occurring at the time of cutting in the layers formed with the holes 20' are curvedly formed in a round shape, instead of a line shape, along a circumference of the holes 20'.

As such, because the round-shaped cracks 40 formed around the holes 20' also affect the shapes of the cracks in the other inorganic layers that are not formed with the holes 20', the overall shape (e.g., the general shape) of the cracks formed on the cutting line of the flexible display panel 1' may have a round shape instead of a line shape.

The flexible display device according to the second example embodiment has been described with a configuration in which the holes 20' are formed only in the interlayer insulating layer 18, but because the inorganic layer 10 may include four layers, including the interlayer insulating layer 18, the gate insulating layer 16, the buffer layer 14, and the barrier layer 12, residual inorganic layers that are not formed with the holes 20' after micro-patterning are, for example, as follows:

1. inorganic ($SiO_x$, $SiN_x$) layer (gate insulating layer~barrier layer);
2. Inorganic ($SiO_x$, $SiN_x$) layer (buffer layer~barrier layer);
3. Inorganic ($SiO_x$, $SiN_x$) layer (barrier layer);
4. Inorganic ($SiO_x$, $SiN_x$) layer (interlayer insulating layer~gate insulating layer);
5. Inorganic ($SiO_x$, $SiN_x$) layer (interlayer insulating layer~buffer layer);
6. Inorganic ($SiO_x$, $SiN_x$) layer (interlayer insulating layer);
7. Inorganic ($SiO_x$, $SiN_x$) layer (gate insulating layer); and/or
8. Inorganic ($SiO_x$, $SiN_x$) layer (buffer layer).

Among the embodiments, there are 15 different configurations in which the holes are not formed in at least one of the four inorganic layers, and the other structures except for the aforementioned 8 structures may also be included.

Figure 6:
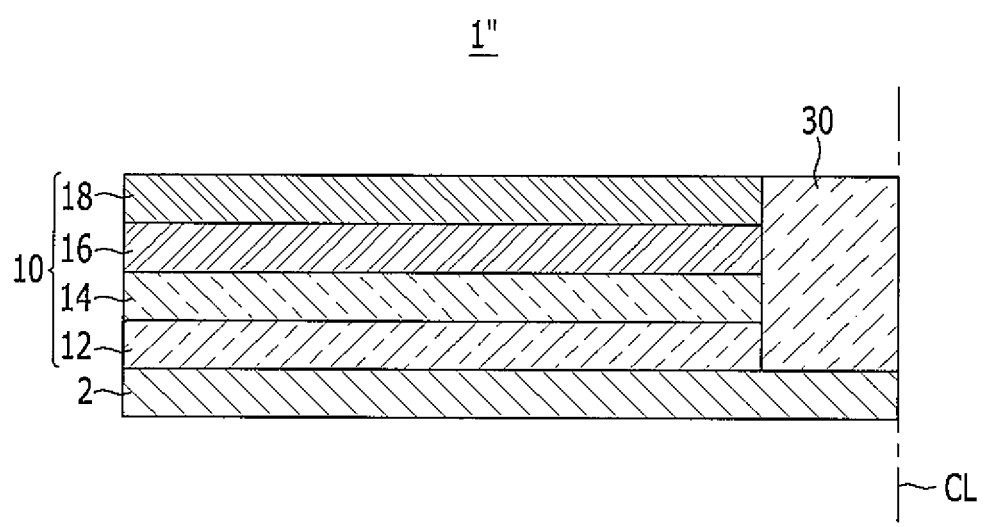
FIG. 6 is a cross-sectional view of a flexible display device according to a third example embodiment.

FIG. 6 is a cross-sectional view of a flexible display panel 1' according to a third example embodiment.

The flexible display panel 1' according to the third example embodiment is formed such that the holes in the inorganic layer 10 of the aforementioned example embodiment (e.g., the holes 20' of the flexible display panel 1') are filled with a resin 30.

Referring to FIG. 6, the resin 30 is filled in spaces that are formed by the holes in the inorganic layer 10 of the flexible display panel 1".

The process for filling the holes with the resin 30 may be performed after the process for forming the holes in the inorganic layer 10.

In this embodiment, the resin 30 filling the holes may be a urethane-based resin, an epoxy-based resin, or an acryl-based resin, but it is not limited thereto.

As such, when the holes in the flexible display panel 1" are filled with the resin 30, the flexible display panel 1 that can be weakened along the cutting line CL may have improved strength along the cutting line CL, such that the flexible display device may be prevented from being broken (e.g., cracked) instead of being cut on the cutting line CL during the manufacturing process of the flexible display device.

While this invention has been described in connection with what is presently considered to be practical example embodiments, it is to be understood that the invention is not limited to the disclosed embodiments, but those skilled in the art may suggest other example embodiments by adding, modifying, or deleting components within the spirit and scope of the appended claims and their equivalents, and these other example embodiments also fall within the scope of the present invention.

What is claimed is:

1. A flexible display device comprising:
    a flexible display panel comprising:
        a plastic film;
        a pixel circuit on the plastic film;
        a light-emitting element; and
        an inorganic layer extending from the pixel circuit, wherein
    openings are in the inorganic layer along a cutting line for cutting the flexible display panel.

2. A flexible display device comprising:
    a flexible display panel comprising:
        a plastic film;
        a pixel circuit on the plastic film;
        a light-emitting element; and
        an inorganic layer, wherein
    openings are in the inorganic layer along a cutting line for cutting the flexible display panel, and
    the inorganic layer comprises:
        an interlayer insulating layer;
        a gate insulating layer;
        a buffer layer; and
        a barrier layer.

3. The device of claim 2, wherein
    the openings are in at least one of the interlayer insulating layer, the gate insulating layer, the buffer layer, or the barrier layer.

4. The device of claim 1, wherein the openings have a circular shape.

5. The device of claim 4, wherein centers of the circular openings are on the cutting line.

6. The device of claim 4, wherein diameters of the openings are in a range of 10 μm to 100 μm.

7. The device of claim 4, wherein the openings comprise a plurality of openings, and the plurality of openings are arranged along the cutting line of the flexible display panel.

8. The device of claim 7, wherein adjacent openings among the plurality of openings are spaced by an interval that is smaller than diameters of the openings.

9. The device of claim 1, wherein the openings are filled with a resin.

10. The device of claim 9, wherein the resin comprises a urethane-based resin, an epoxy-based resin, or an acryl-based resin.

11. The device of claim 2, wherein the openings have a circular shape.

12. The device of claim 11, wherein centers of the circular openings are on the cutting line.

13. The device of claim 12, wherein diameters of the openings are in a range of 10 μm to 100 μm.

14. The device of claim 12, wherein the openings comprise a plurality of openings, and the plurality of openings are arranged along the cutting line of the flexible display panel.

15. The device of claim 14, wherein adjacent openings among the plurality of openings are spaced by an interval that is smaller than diameters of the openings.

* * * * *